(12) United States Patent
Na et al.

(10) Patent No.: US 11,281,093 B2
(45) Date of Patent: Mar. 22, 2022

(54) SYSTEMS AND METHODS USING MASK PATTERN MEASUREMENTS PERFORMED WITH COMPENSATED LIGHT SIGNALS

(71) Applicant: Samsung Electronics Co., Ltd., Suwon-si (KR)

(72) Inventors: Ji Hoon Na, Bucheon-si (KR); Dong Gun Lee, Hwaseong-si (KR); Hee Bom Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/342,611

(22) Filed: Jun. 9, 2021

(65) Prior Publication Data

US 2021/0302828 A1   Sep. 30, 2021

Related U.S. Application Data

(63) Continuation of application No. 16/114,880, filed on Aug. 28, 2018, now Pat. No. 11,061,322.

(30) Foreign Application Priority Data

Feb. 1, 2018 (KR) .................. 10-2018-0012802

(51) Int. Cl.
*G03F 7/20* (2006.01)
*G03F 1/84* (2012.01)
*G03F 1/22* (2012.01)

(52) U.S. Cl.
CPC .................. *G03F 1/84* (2013.01); *G03F 1/22* (2013.01); *G03F 7/702* (2013.01);
(Continued)

(58) Field of Classification Search
CPC ..... G03F 1/22; G03F 1/24; G03F 1/84; G03F 7/70033; G03F 7/702; G03F 7/70233;
(Continued)

(56) References Cited

U.S. PATENT DOCUMENTS 6,972,836 B2   12/2005   Sato et al.
7,408,646 B2   8/2008   Rau et al.
(Continued)

FOREIGN PATENT DOCUMENTS

JP          4230676 B2      11/2002
JP       2013175684 A       9/2013
(Continued)

*Primary Examiner* — Colin W Kreutzer
(74) *Attorney, Agent, or Firm* — Muir Patent Law, PLLC

(57) ABSTRACT

A system includes a plate configured for mounting of a reflective extreme ultra-violet (EUV) mask thereon and a zone plate configured to divide EUV light into zero-order light and first-order light and to pass the zero-order light and the first-order light to the reflective EUV mask. The system further includes a detector configured to receive EUV light reflected by the EUV mask and including a zero-order light detection region configured to generate a first image signal and a first-order light detection region configured to generate a second image signal, and a calculator configured to generate a compensated third image signal from the first image signal and the second image signal. The third image signal may be used to determine a distance between mask patterns of the EUV mask.

8 Claims, 12 Drawing Sheets

(52) U.S. Cl.
CPC ........ *G03F 7/70033* (2013.01); *G03F 7/7085* (2013.01); *G03F 7/70233* (2013.01); *G03F 7/70283* (2013.01); *G03F 7/70316* (2013.01); *G03F 7/70491* (2013.01); *G03F 7/70591* (2013.01); *G03F 7/70866* (2013.01)

(58) Field of Classification Search
CPC ............. G03F 7/70283; G03F 7/70316; G03F 7/70491; G03F 7/70591; G03F 7/7085; G03F 7/70866
USPC ........................ 355/30, 67, 68, 75, 77; 430/5
See application file for complete search history.

(56) References Cited

U.S. PATENT DOCUMENTS

| | | | |
|---|---|---|---|
| 8,040,511 | B1 | 10/2011 | Krishnan et al. |
| 8,335,038 | B2 | 12/2012 | Lee et al. |
| 9,213,003 | B2 | 12/2015 | Perlitz |
| 9,222,834 | B2 | 12/2015 | Den Boef |
| 2002/0001758 | A1* | 1/2002 | Petersen ............. G03F 7/70125 430/5 |
| 2004/0057107 | A1 | 3/2004 | Yun et al. |
| 2008/0119060 | A1 | 5/2008 | Goodwin |
| 2013/0161543 | A1 | 6/2013 | Park et al. |
| 2013/0221556 | A1 | 8/2013 | Miyaharu et al. |
| 2013/0308125 | A1* | 11/2013 | Perlitz ................. G03F 7/70483 356/237.4 |
| 2016/0161863 | A1 | 6/2016 | Den Boef et al. |
| 2017/0075231 | A1 | 3/2017 | Ekinci et al. |
| 2017/0221194 | A1 | 8/2017 | Ebstein |

FOREIGN PATENT DOCUMENTS

| | | |
|---|---|---|
| KR | 20170085116 A | 7/2017 |
| WO | 2016/083076 A1 | 6/2016 |

\* cited by examiner

SYSTEMS AND METHODS USING MASK PATTERN MEASUREMENTS PERFORMED WITH COMPENSATED LIGHT SIGNALS

CROSS-REFERENCE TO RELATED APPLICATION

This application is a continuation of and claims priority to U.S. patent application Ser. No. 16/114,880 filed on Aug. 28, 2018, which claims priority under 35 USC§ 119 to Korean Patent Application No. 10-2018-0012802, filed on Feb. 1, 2018 in the Korean Intellectual Property Office (KIPO), the contents of which are herein incorporated by reference in their entirety.

BACKGROUND

1. Field of the Inventive Concept

The present inventive concept relates to semiconductor device processing apparatus and methods and, more particularly, to imaging apparatus and methods for mask inspection and semiconductor device fabrication using the same.

2. Description of the Related Art

Recently, semiconductor devices have been miniaturized and have been improved in performance. As a result, an interval between the wirings included in the semiconductor device becomes narrower and narrower. As the interval between the wirings included in the semiconductor device becomes narrower, the importance of inspection of a mask used for patterning the wiring on the semiconductor substrate increases.

To inspect a mask on which a mask pattern is drawn, a light source with a short wavelength is desirable. Extreme ultra-violet (EUV) light may be used as a light source with short wavelength.

If a fluctuation occurs in an image signal including information on an image of a mask pattern, measurement of the interval between the mask patterns may become inaccurate.

SUMMARY

Embodiments of the present inventive concept provide imaging systems and methods using such systems capable of improving an accuracy of an image of a reflective EUV mask According to some embodiments of the present inventive concept, a system includes a plate configured for mounting of a reflective extreme ultra-violet (EUV) mask thereon and a zone plate configured to divide EUV light into zero-order light and first-order light and to pass the zero-order light and the first-order light to the reflective EUV mask. The system further includes a detector configured to receive EUV light reflected by the EUV mask and including a zero-order light detection region configured to generate a first image signal and a first-order light detection region configured to generate a second image signal, and a calculator configured to generate a compensated third image signal from the first image signal and the second image signal.

Further embodiments provide a system includes a plate configured for mounting a reflective EUV mask thereon and a zone plate configured to divide EUV light into zero-order light and first-order light and to pass the zero-order light and the first-order light to the reflective EUV mask. The system further includes a detector configured to separately detect zero-order EUV light reflected by the EUV mask and first-order EUV light reflected by the EUV mask.

According to some method embodiments, EUV light reflected from a reflective EUV mask including first and second spaced-apart mask patterns is detected. Respective first and second image signals corresponding to zero-order light and first-order light reflected by the EUV mask are generated. A third image signal is generated from the first and second image signals. A distance between the first mask pattern and the second mask pattern is determined using the third image signal. Patterns are formed on a substrate using the reflective EUV mask.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, an imaging device and an imaging system including the same according to some embodiments of the present inventive concept will be described with reference to FIGS. 1 to 6.

Figure 1:
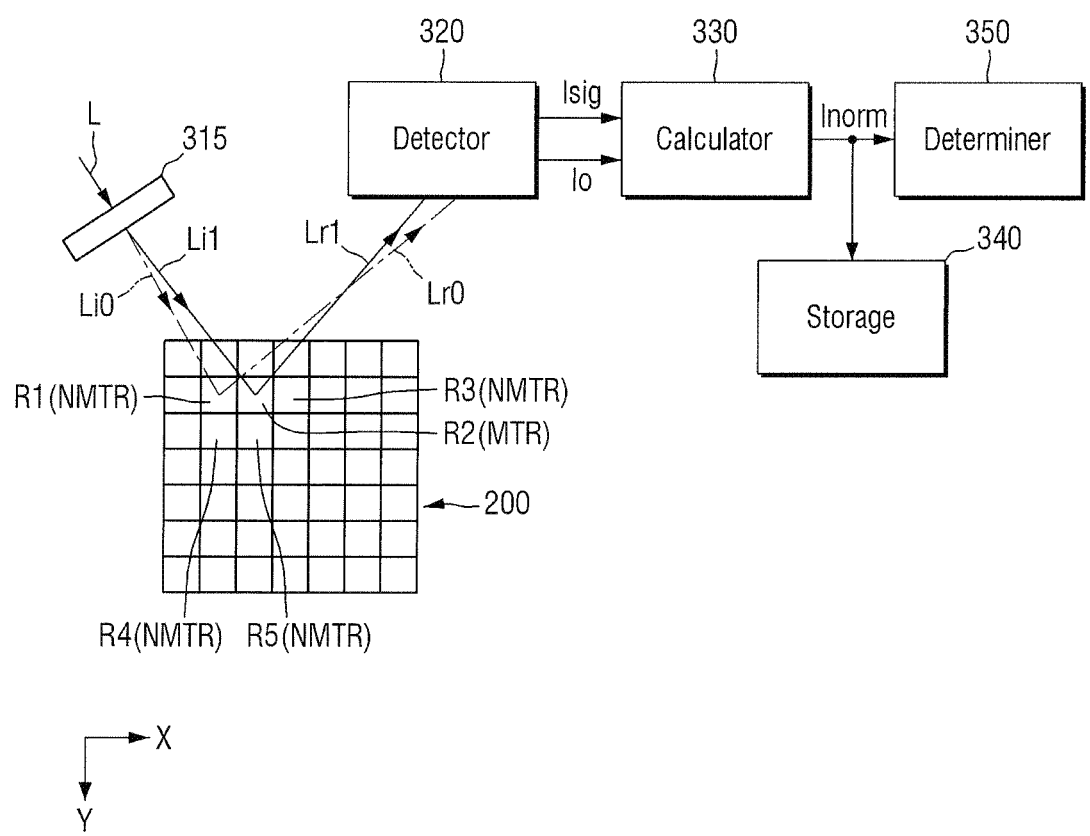
FIG. 1 is a block diagram illustrating an imaging device and an imaging system including the same according to some embodiments of the present inventive concept.

FIG. 1 is a block diagram illustrating an imaging device and an imaging system including the same according to some embodiments of the present inventive concept.

Referring to FIG. 1, an imaging system according to some embodiments of the present inventive concept may include an imaging device, a calculator 330, storage medium 340, and a determiner 350.

The imaging device may include a zone plate 315 and a detector 320. However, the present inventive concept is not limited thereto. For example, the imaging device may further include an EUV light source, an X-ray mirror, and the like, and details thereof will be described later with reference to FIG. 2.

The zone plate 315 may diffract the EUV light L. For example, the zone plate 315 may separate the EUV light L into zero-order incident light Li0 and first-order incident light Li1.

The zero-order incident light Li0 may be, for example, light which goes straight from the zone plate 315. The first-order incident light Li1 may be, for example, light diffracted by the zone plate 315. The first-order incident light Li1 may proceed toward the plate (210 of FIG. 2) at a certain angle from the zone plate 315 on the basis of the zero-order incident light Li0. The zone plate 315 may cause the first-order incident light Li1 to be condensed on a measurement target region MTR of the reflective EUV mask 200. The reflective EUV mask 200 may be included in an imaging system, for example, for defect inspection of the reflective EUV mask 200.

The zero-order reflected light Lr0 and the first-order reflected light Lr1 reflected from the plate (210 of FIG. 2) may enter the detector 320. For example, the zero-order reflected light Lr0 may be light obtained by reflection of the zero-order incident light Li0 from a region NMTR other than the measurement target region MTR of the reflective EUV mask 200. The first-order reflected light Lr1 may be light obtained by reflection of first-order incident light Li1 from the measurement target region MTR of the reflective EUV mask 200.

The reflective EUV mask 200 may include a first region R1, a second region R2, a third region R3, a fourth region R4, and a fifth region R5. Detailed description of the first region R1, the second region R2, the third region R3, the fourth region R4, and the fifth region R5 of the reflective EUV mask 200h will be described later with reference to FIG. 8.

The detector 320 may individually detect the zero-order reflected light Lr0 and the first-order reflected light Lr1. The detector 320 may output a first image signal Io relating to the zero-order reflected light Lr0 and a second image signal Isig relating to the first-order reflected light Lr1.

The calculator 330 may receive the first image signal Io and the second image signal Isig and may generate a third image signal Inorm. The third image signal Inorm may be a signal in which the second image signal Isig is compensated using the first image signal Io.

The storage medium 340 may store the third image signal Inorm. For example, the storage medium 340 may store information on the third image signal Inorm for each of a plurality of regions of the reflective EUV mask 200 in the form of a matrix. For example, when the second region R2 of the reflective EUV mask 200 is the measurement target region MTR, the storage medium 340 may store the third image signal Inorm of the second region R2 in third row and second column of the matrix.

The determiner 350 may measure an interval between the mask patterns drawn in one region of the reflective EUV mask 200 using the third image signal Inorm. In some embodiments, the determiner 350 may determine the presence or absence of a defect of the reflective EUV mask 200 based on the measured interval between the mask patterns.

For example, the reflective EUV mask 200 may include a plurality of regions. The plurality of regions may include first, second, third, fourth and fifth regions R1, R2, R3, R4, R5. Each of the first, second, third, fourth and fifth regions R1, R2, R3, R4, R5 may include a plurality of mask patterns spaced apart from each other. For example, first and second mask patterns spaced apart from each other may be drawn in the second region R2 which is the measurement target region MTR. The determiner 350 may measure the interval between the first and second mask patterns, using the third image signal Inorm.

Some details of the above-mentioned contents will be described below with reference to FIGS. 2 to 6. However, for the sake of clarity of explanation, repeated description will be omitted or simplified.

Figure 2:
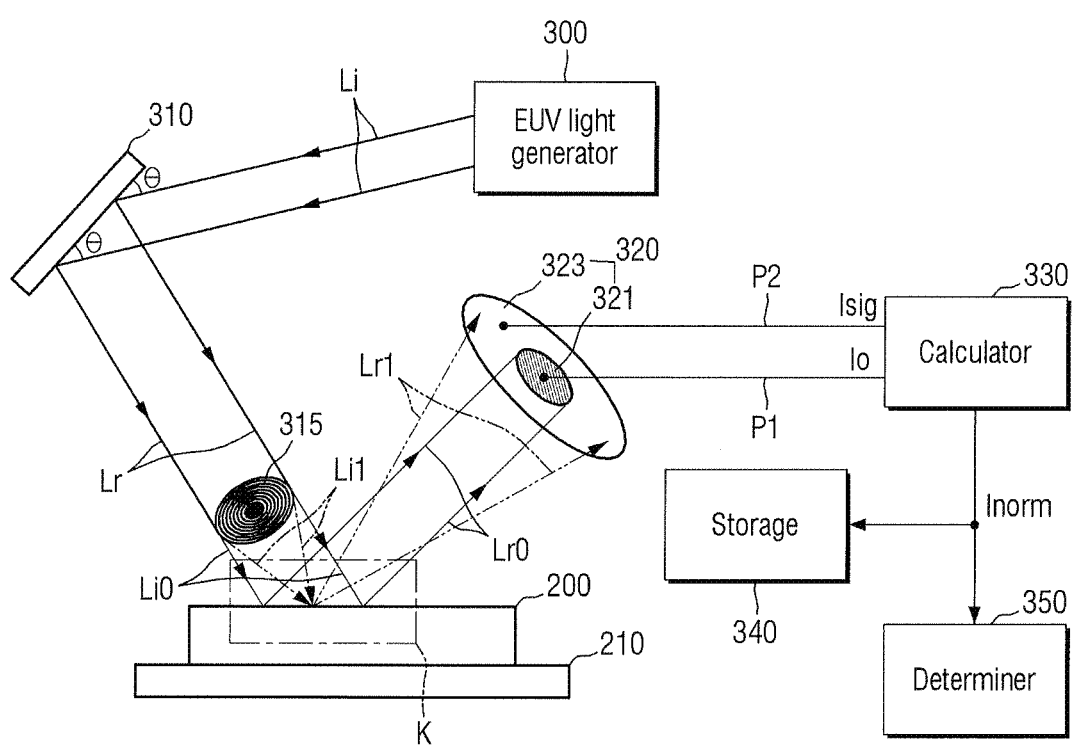
FIG. 2 is a diagram for explaining the imaging device and the image system including the same according to some embodiments of the present inventive concept.
Figure 3:
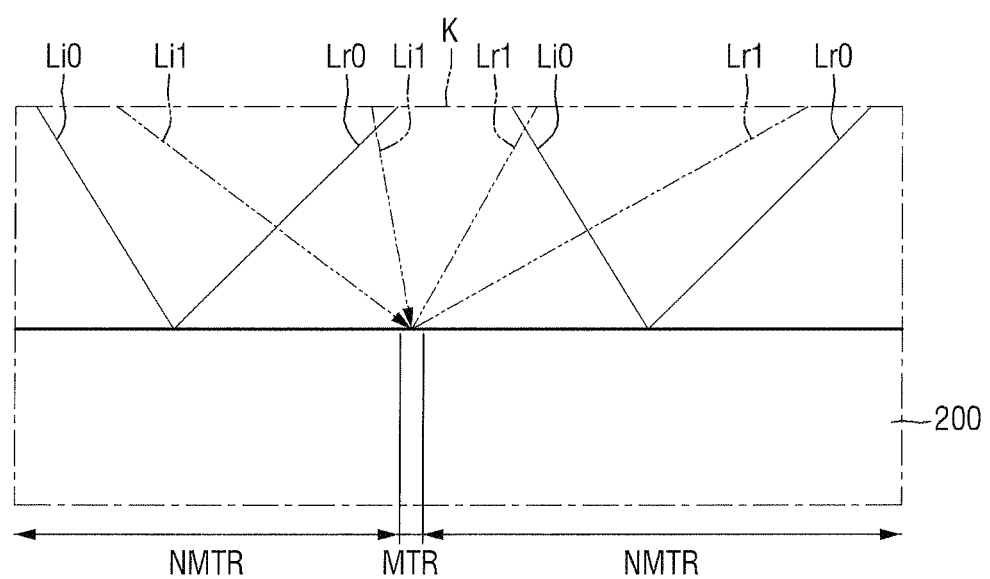
FIG. 3 is an enlarged view of a region K of FIG. 2.
Figure 4:
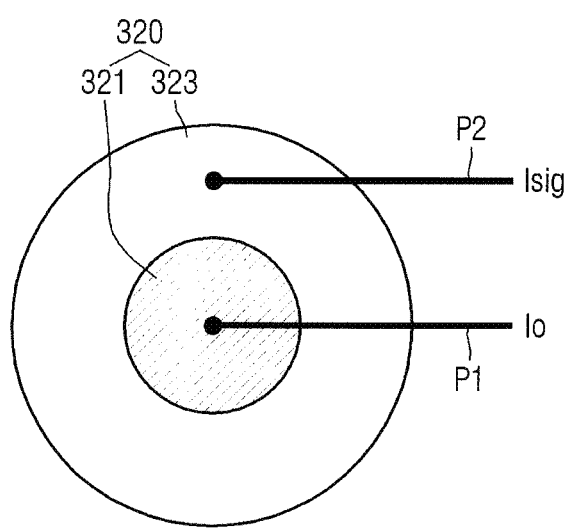
FIG. 4 is a diagram for explaining a detector of FIG. 2.

FIG. 2 is a diagram for explaining an imaging device and an image system including the same according to some embodiments of the present inventive concept. FIG. 3 is an enlarged view of a region K of FIG. 2. FIG. 4 is a diagram for explaining the detector 320 of FIG. 2.

Referring to FIGS. 2 through 4, a reflective EUV mask 200 may be disposed on the plate 210. The EUV light generator 300 may generate EUV incident light Li. The EUV light generator 300 may irradiate the X-ray mirror 310 with EUV incident light Li.

The EUV incident light Li generated from the EUV light generator 300 may be reflected after entering the X-ray mirror 310. The EUV incident light Li may enter the X-ray mirror 310 at a first incident angle θ. The EUV incident light Li entering the X-ray mirror 310 at the first incident angle θ may be reflected from the X-ray mirror 310. The EUV reflected light Lr may be reflected light of the EUV incident light Li from the X-ray mirror 310.

The X-ray mirror 310 may be, for example, spaced apart from the zone plate 315. The X-ray mirror 310 may be disposed, for example, on the zone plate 315. However, the present inventive concept is not limited thereto. For example, as long as the X-ray mirror 310 is disposed to be able to reflect the EUV incident light Li entering from the EUV light generator 300 and to allow the EUV incident light Li to enter the zone plate 315, the X-mirror 310 may be placed apart from the zone plate 315.

The EUV reflected light Lr may enter the zone plate 315. The EUV light L of FIG. 1 may be EUV reflected light Lr.

The zone plate 315 separates the incident EUV reflected light Lr into the zero-order incident light Li0 and the first-order incident light Li1 and may irradiate the plate 210 with the separated incident light. For example, the zone plate 315 separates the incident EUV reflected light Lr into the zero-order incident light Li0 and the first-order incident light Li1, and may irradiate the reflective EUV mask 200 located on the plate 200 for defect inspection with the separated incident light. The zone plate 315 may condense the first-order incident light Li1 on the measurement target region MTR of the reflective EUV mask 200.

The zone plate 315 may be spaced apart from the plate 210. For example, the zone plate 315 may be placed on the plate 210. However, the present inventive concept is not limited thereto. For example, as long as the zone plate 315 has an arrangement capable of condensing the first-order incident light Li1 on the measurement target region MTR of the reflective EUV mask 200, the zone plate 315 may be placed apart from the plate 210, and other constituent elements may be disposed between the zone plate 315 and the plate 210.

The detector 320 may be spaced apart from the plate 210, the zone plate 315 and the EUV light generator 300. The detector 320 may be disposed, for example, on the plate 210 to face the zone plate 315. However, the present inventive concept is not limited thereto. For example, as long as the detector 320 has an arrangement capable of detecting the zero-order reflected light Lr0 and the first-order reflected light Lr1, the detector 320 may be disposed such that it does not face the zone plate 315.

The detector 320 may include a zero-order light detection region 321 and a first-order light detection region 323. The zero-order light detection region 321 of the detector 320 may detect the zero-order reflected light Lr0 among the zero-order reflected light Lr0 and the first-order reflected light Lr1. The first-order light detection region 323 of the detector 320 may detect the first-order reflected light Lr1 among the zero-order reflected light Lr0 and the first-order reflected light Lr1.

Specifically, the zero-order light detection region 321 of the detector 320 may detect the zero-order reflected light Lr0 reflected from the region NMTR outside of the measurement target region MTR of the reflective EUV mask 200. In other words, the zero-order reflected light Lr0 may enter the zero-order light detection region 321 of the detector 320. The first-order light detection region 323 of the detector may detect the first-order reflected light Lr1 reflected from the measurement target region MTR of the reflective EUV mask 200. In other words, the first-order reflected light Lr1 may enter the first-order light detection region 323 of the detector 320.

In some embodiments, the first-order light detection region 323 of the detector 320 may surround the zero-order light detection region 321 of the detector 320.

Separate probes may be connected to each of the zero-order light detection region 321 and the first-order light detection region 323 of the detector 320.

The first probe P1 may be connected to the zero-order light detection region 321 of the detector 320. The first probe P1 may output a first image signal Io relating to the zero-order reflected light Lr0. Since the zero-order reflected light Lr0 is light reflected from the region NMTR other than the measurement target region of the reflective EUV mask 200, the first image signal Io may not contain information on the image of the measurement target region MTR of the reflective EUV mask 200.

The second probe P2 may be connected to the first-order light detection region 323 of the detector 320. The second probe P2 may output the second image signal Isig relating to the first-order reflected light Lr1. Since the first-order reflected light Lr1 is the light reflected from the measurement target region MTR of the reflective EUV mask 200, the second image signal Isig may contain information on the image of the measurement target region MTR of the reflective EUV mask 200.

Figure 5:
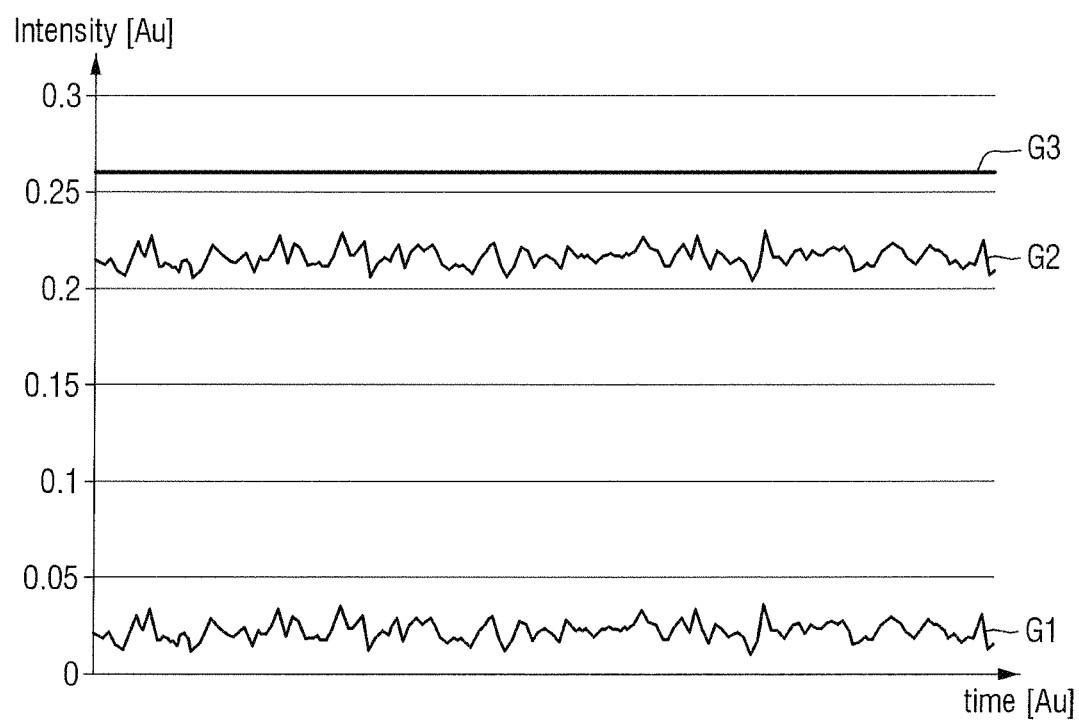
FIG. 5 is a graph for explaining an calculator of the imaging device and the imaging system including the same according to some embodiments of the present inventive concept.

FIG. 5 is a graph for explaining a calculator 330 of an imaging device and an imaging system including the same according to some embodiments of the present inventive concept. An x-axis of the graph of FIG. 5 may be a time (unit: AU (Arbitrary Unit)), and a y-axis may be an intensity (unit: AU).

Referring to FIGS. 2 and 5, the intensity of the second image signal Isig may be greater than the intensity of the first image signal Io. In the graph of FIG. 5, a first graph G1 may show the intensity of the first image signal Io. A second graph G2 may show the intensity of the second image signal Isig. A third graph G3 may show the intensity of the third image signal Inorm.

The signals in each of the first graph G1 and the second graph G2 may fluctuate. In other words, each of the first image signal Io and the second image signal Isig may not have a constant intensity. Fluctuations of the signal of the first graph G1 may directly follow the fluctuations of the signal of the second graph G2. In other words, the first graph G1 and the second graph G2 may have different intensities but similar shapes. The fluctuation of the signals of the first graph G1 and the second graph G2 may be caused, for example, by a variation in a power supply applied to the EUV light generator 300.

Since the second image signal Isig is a signal relating to the first-order reflected light Lr1 reflected from the measurement target region MTR of the reflective EUV mask 200, the second image signal Isig may contain information on the image of the measurement target region MTR of the reflective EUV mask 200.

The calculator 330 may receive input of the first image signal Io from the first probe P1, and may receive input the second image signal Isig from the second probe P2. The calculator 330 may generate the third image signal Inorm. The calculator 330 may compensate the second image signal Isig based on the first image signal Io. The calculator 330 may, for example, divide the second image signal Isig by the first image signal Io to generate a third image signal Inorm, as in Formula I.

$$I_{norm} = \frac{I_{sig}}{I_o} \quad \text{(Formula 1)}$$

The third image signal Inorm may be a normalized signal. As shown in the third graph G3, the intensity of the third image signal Inorm may be constant. Further, the intensity of the third image signal Inorm may be greater than the intensity of the second image signal Isig and the intensity of the first image signal Io.

Since the third image signal Inorm is a normalized signal produced from the second image signal Isig, the third image signal Inorm may contain information on the image of the measurement target region MTR of the reflective EUV mask 200. Therefore, the third image signal Inorm may be used to perform imaging of the measurement target region MTR of the reflective EUV mask 200 and to perform the defect inspection of the measurement target region MTR of the reflective EUV mask 200. The third image signal Inorm may be stored in the storage medium 340.

Figure 6:
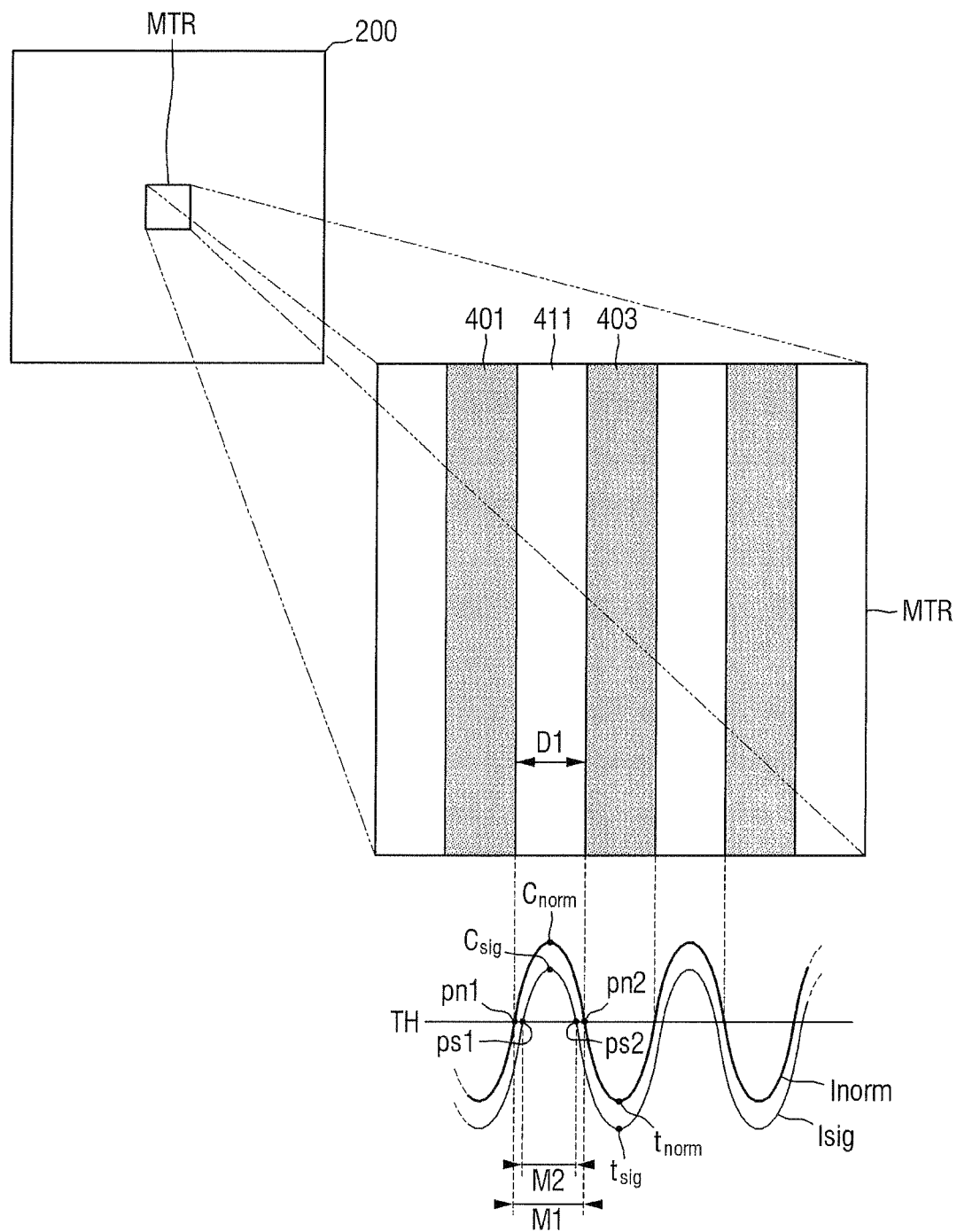
FIG. 6 is a diagram for explaining a determiner of FIG. 2.

FIG. 6 is a diagram for explaining operations of the determiner 350 of FIG. 2. Referring to FIGS. 2 and 6, the measurement target region MTR of the reflective EUV mask 200 may include a first mask pattern 401 and a second mask pattern 403 spaced apart from each other.

A first separation region 411 may be a region between the first mask pattern 401 and the second mask pattern 403. The first separation region 411 may have a first interval Dl. The first interval D1 may be an interval between the first mask pattern 401 and the second mask pattern 403. The first interval D1 may be a value to be measured by the imaging device and the imaging system including the same according to some embodiments of the present inventive concept. The imaging device and the imaging system including the same according to some embodiments of the present inventive concept may determine the presence of defects of the reflective EUV mask 200 to be inspected, using the measured first interval Dl.

For example, the determiner 350 may receive input of the third image signal Inorm. The determiner 350 may measure the interval between two points at which the third image signal Inorm crosses a threshold value TH, and may obtain a value substantially similar to the first interval D1 (for example, the first measured value M1). The threshold value TH may represent, for example, a certain current level. For example, the third image signal Inorm may be an indirect current.

For example, in FIG. 6, a peak $c_{sig}$ of the second image signal Isig and a peak $c_{norm}$ of the third image signal Inorm may appear in the first separation region 411. Further, a valley $t_{sig}$ of the second image signal Isig and a valley $t_{norm}$ of the third image signal Inorm may be displayed in each of the first mask pattern 401 and the second mask pattern 403.

Considering a case where the third image signal Inorm is used to measure the first interval D1 as an example, to measure the first interval D1 of the first separation region 411, among the points at which the third image signal Inorm crosses the threshold value TH, the interval between the points at which the third image signal Inorm crosses the threshold value TH on both sides of the peak $c_{sig}$ may be measured. For example, among the points at which the third image signal Inorm crosses the threshold value TH, the points at which the threshold value third image signal Inorm crosses the threshold value TH on both sides of the peak $c_{sig}$, are labeled pn1 and pn2. Based on the third image signal Inorm, the first interval D1 may be determined as the first measured value M1.

Considering a case where the second image signal Isig is used to measure the first interval D1 as an example, in order to measure the first interval D1 of the first separation region 411, among the points at which the second image signal Isig crosses the threshold value TH, the separation between the points at which the threshold value TH meets the second image signal Isig on both sides around the peak $c_{sig}$ may be measured. For example, among the points at which the second image signal Isig crosses the threshold value TH, the points at which the second image signal Isig crosses the threshold value TH on both sides around the peak $c_{sig}$ may labeled ps1 and ps2. According to the second image signal Isig, the first interval D1 may be determined as the second measured value M2. The first measured value M1 may be substantially the same as the first interval D1. The second measured value M2 may be smaller than the first interval D1.

An imaging device and the imaging system including the same according to some embodiments of the present inventive concept may improve the accuracy of the image of the reflective EUV mask 200, by detecting each of the zero-order reflected light Lr0 and the first-order reflected light Lr1 reflected from the reflective EUV mask 200 and by utilizing the reflected light for imaging of the measurement target region MTR of the reflective EUV mask 200.

By utilizing the third image signal Inorm obtained by compensating for the second image signal Isig to image the measurement target region MTR of the reflective EUV mask 200, it is possible to obtain substantially the same measured value (e.g., the first measured value M1) as the interval between the mask patterns (e.g., the first interval D1). By performing imaging on the reflective EUV mask 200 on the basis of the obtained measured value (e.g., the first measured value M1), the accuracy of the image can be improved. Further, since substantially the same measured value (e.g., the first measured value M1) as the interval between the mask patterns (e.g., the first interval D1) is obtained using the third image signal Inorm, the reliability of the defect inspection of the reflective EUV mask 200 can be improved.

In some embodiments, the calculator 330 and the determiner 350 may be implemented using software configured to execute on a data processing apparatus. Such software may include procedures and functions may be implemented together with another software module that causes at least one function or operation to be executed. The software code may be implemented by a software application written in an appropriate programming language.

In some embodiments, the imaging device and the imaging system including the same may further include a display for displaying to the user at least one of the first, second, and third image signals (Io, Isig, Inorm).

In the drawings, the imaging device and the imaging system including the same are illustrated as including the EUV light generator 300, but the present inventive concept is not limited thereto. For example, the EUV light generator 300 may, of course, be placed outside the imaging device and the imaging system including the same.

In the drawings, the imaging system is illustrated as including the X-ray mirror 310, the calculator 330, the storage medium 340 and the determiner 350, but the present inventive concept is not limited thereto. For example, other constituent elements may be further included and/or omitted as necessary.

Hereinafter, the detector 320 of the imaging device and an imaging system including the same according to some embodiments of the present inventive concept will be described with reference to FIGS. 2, 3, and 7. For the sake of clarity of explanation, repeated description of elements described above will be omitted or simplified.

Figure 7:
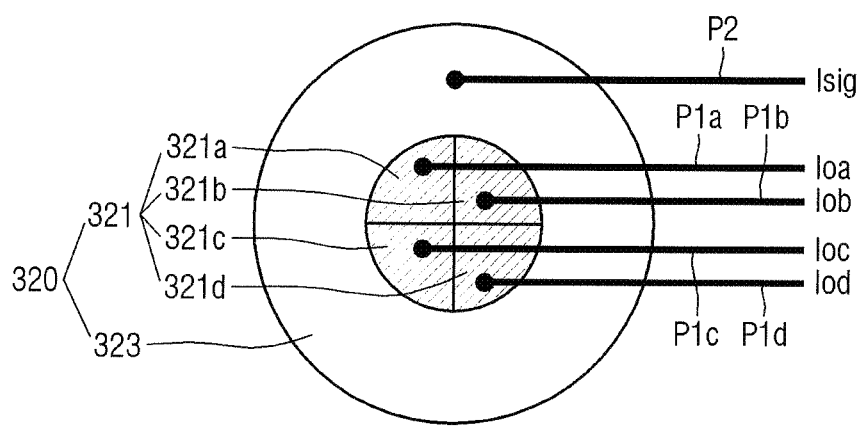
FIG. 7 is a diagram for explaining the detector of FIG. 2.

FIG. 7 is a diagram for explaining the detector 320 of FIG. 2. Referring to FIGS. 2, 3, and 7, unlike FIG. 2, the zero-order light detection region 321 of the detector 320 may include a plurality of zero-order light sub-detection regions. The plurality of zero-order light sub-detection regions may include a first sub-detection region 321a, a second sub-detection region 321b, a third sub-detection region 321c, and a fourth sub-detection region 321d.

Respective ones of a plurality of first sub-probes may be connected to the plurality of zero-order light sub-detection regions. For example, a sub-probe P1a, a second sub-probe P1b, a third sub-probe P1c, and a fourth sub-probe P1d may be connected to each of a first sub-detection region 321a, a second sub-detection region 321b, a third sub-detection region 321c, and a fourth sub-detection region 321d. The first sub-probe P1a, the second sub-probe P1b, the third sub-probe P1c, and the fourth sub-probe P1d may output a first sub-image signal Ioa, a second sub-image signal Iob, a third sub-image signal Ioc, and a fourth sub-image signal Iod, respectively.

When the zero-order reflected light Lr0 enters the zero-order light detection region 321, each of the plurality of first sub-probes may output intensity of the zero-order reflected light Lr0 in each of the plurality of zero-order light sub-detection regions. For example, the first sub-image signal Ioa, the second sub-image signal Iob, the third sub-image signal Ioc, and the fourth sub-image signal Iod may be related to the zero-order reflected light Lr0 in each of the first sub-detection region 321a, the second sub-detection region 321b, the third sub-detection region 321c, and the fourth sub-detection region 321d, when the zero-order reflected light Lro enters the zero-order light detection region 321.

In some embodiments, when the EUV light generator 300, the X-ray mirror 310 and the zone plate 315 are aligned, intensities of the zero-order reflected light Lr0 in each of the first sub-detection region 321a, the second sub-detection region 321b, the third sub-detection region 321c, and the fourth sub-detection region 321d may be the same. Here, the case where the EUV light generator 300, the X-ray mirror 310, and the zone plate 315 are aligned may mean a case where the first-order incident light Li1 is condensed on the measurement target region MRT of the reflective EUV mask 200.

For example, FIG. 2 illustrates a case where the EUV light generator 300, the X-ray mirror 310 and the zone plate 315 are aligned. When the EUV incident light Li enters the X-ray mirror 310 at the first incident angle θ, intensities of each of the first sub image signal Ioa, the second sub image signal Iob, the third sub-image signal Ioc, and the fourth sub-image signal Iod may be the same.

When the EUV light generator 300, the X-ray mirror 310 and the zone plate 315 are misaligned, intensity of the zero-order reflected light Lr0 in each of the first sub-detection region 321a, the second sub-detection region 321b, the third sub-detection region 321c and the fourth sub-detection region 321d may not be the same. For example, the intensity of the zero-order reflected light Lr0 in each of the first sub-detection region 321a and the second sub-detection region 321b may be greater than the intensity of the zero-order reflected light Lr0 in each of the third sub-detection region 321c and the fourth sub-detection region 321d. This may mean that the EUV light generator 300 is moved to the side of the first sub-detection region 321a and the second sub-detection region 321b. By comparing the intensities of the zero-order reflected light Lr0 in each sub-detection region to grasp the direction of movement of the EUV light generator 300, it is possible to determine an optimum incident angle for condensing the first-order incident light Li1 in the measurement target region MTR of the reflective EUV mask 200. Here, the incident angle may be an incident angle which enters the X-ray mirror 310 from the EUV light generator 300.

In some embodiments, when the EUV light generator 300, the X-ray mirror 310 and the zone plate 315 are aligned, the intensity of the zero-order reflected light Lr0 in each of the first sub-detection region 321a, the second sub-detection region 321b, the third sub-detection region 321c and the fourth sub-detection region 321d may have a maximum value.

For example, when the EUV incident light Li enters the X-ray mirror 310 at the first incident angle θ, intensities of each the first sub-image signal Ioa, the second sub-image signal Iob, the third sub-image signal Ioc, and the fourth sub-image signal Iod may have maximum values. In other words, the first incident angle θ may be the incident angle when each of the first sub-image signal Ioa, the second sub-image signal Iob, the third sub-image signal Ioc, and the fourth sub-image signal Iod measured from each of the first sub-detection region 321a, the second sub-detection region 321b, the third sub-detection region 321c, and the fourth sub-detection region 321d has the maximum value.

Hereinafter, the imaging device and the imaging system including the same according to some embodiments of the present inventive concept will be described with reference to FIGS. 1, 2, and 8. For the sake of clarity of explanation, the repeated description of items described above will be omitted or simplified.

Figure 8:
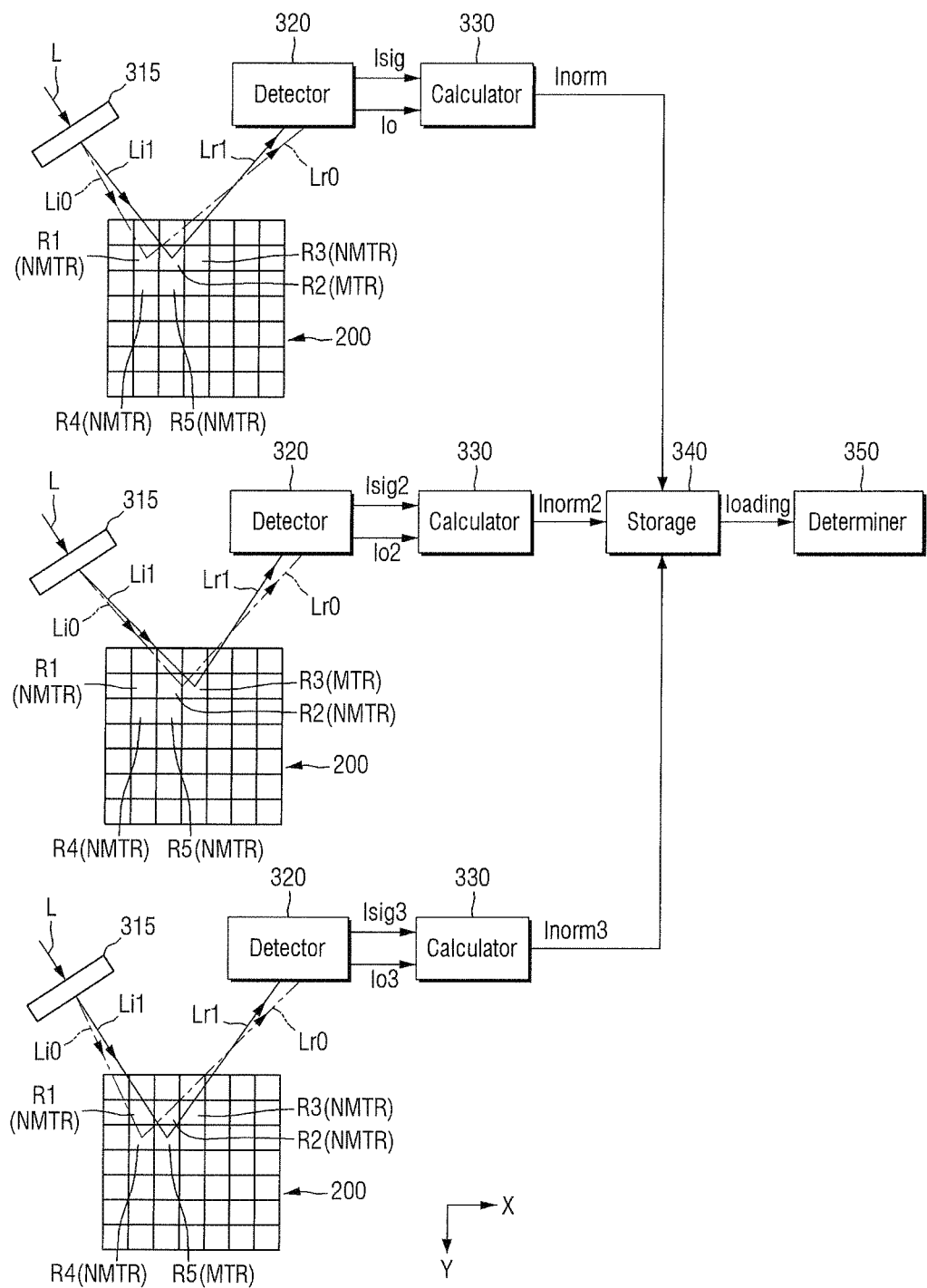
FIG. 8 is a diagram for explaining the imaging device and the imaging system including the same according to some embodiments of the present inventive concept.

FIG. 8 is a diagram for explaining the imaging device and the imaging system including the same according to some embodiments of the present inventive concept. Referring to FIGS. 1, 2 and 8, the imaging device and the imaging system including the same may be moved in a first direction x and a second direction y to scan all the regions of the reflective EUV mask 200.

In some embodiments, the plate 210 on which the reflective EUV mask 200 is located may move. The reflective EUV mask 200 may include a first region R1, a second region R2, a third region R3, a fourth region R4, and a fifth region R5. The first region R1, the second region R2 and the third region R3 may be regions disposed along the first direction x. The first region R1 and the fourth region R4 may be regions disposed along the second direction y. The second region R2 and the fifth region R5 may be regions disposed along the second direction y.

In FIG. 8, the reflective EUV mask 200 may be represented by a 7×7 matrix. The measurement target region MTR of the reflective EUV mask 200 may be the second region R2. The first region R1, the third region R3, the fourth region R4, and the fifth region R5 may be regions NMTR other than the measurement target region. The zero-order reflected light Lr0 reflected from the region NMTR other than the measurement target region and the first-order reflected light Lr1 reflected from the second region R2 may be detected by the detector 320.

The calculator 330 receives the first image signal Io relating to the zero-order reflected light Lr0 and the second image signal Isig relating to the first-order reflected light Lr1, and may generate the third image signal Inorm. The generated third image signal Inorm may be stored in the storage medium 340. The output of the calculator 330 for each of region of the reflective EUV mask 200 may be stored in the storage medium 340 in a matrix format, e.g., the third image signal Inorm may be stored in the third row and second column of the matrix.

The plate 210 is moved in the first direction x, and the measurement target region MTR of the reflective EUV mask 200 may be the third region R3. The first region R1, the second region R2, the fourth region R4 and the fifth region R5 may be the regions NMTR other than the measurement target region. The zero-order reflected light Lr0 reflected from the regions NMTR other than the measurement target region and the first-order reflected light Lr1 reflected from the third region R3 may be detected by the detector 320.

The calculator 330 may receive the fourth image signal Io2 relating to the zero-order reflected light Lr0 and the fifth image signal Isig2 relating to the first-order reflected light Lr1, and may generate a sixth image signal Inorm2. The generated sixth image signal Inorm2 may be stored in the storage medium 340. The sixth image signal Inorm2 may be stored in the fourth row and second column of the matrix.

In some embodiments, after the plate 210 moves in the first direction x, when all the regions of the reflective EUV mask 200 of one row are scanned, the plate 210 may move in the second direction y. The plate 210 is moved in the second direction y, and the measurement target region MTR of the reflective EUV mask 200 may be the fifth region R5. The first region R1, the second region R2, the third region R3, and the fourth region R4 may be the regions NMTR other than the measurement target region. The zero-order reflected light Lr0 reflected from the regions NMTR other than the measurement target region and the first-order reflected light Lr1 reflected from the fifth region R5 may be detected by the detector 320.

The calculator 330 receives a seventh image signal Io3 relating to the zero-order reflected light Lr0 and an eighth image signal Isig3 relating to the first-order reflected light Lr1, and may generate a ninth image signal Inorm3. The generated ninth image signal Inorm3 may be stored in the storage medium 340. The ninth image signal Inorm3 may be stored in the third row and third column of the matrix. The imaging device and the imaging system including the same may scan all regions of the reflective EUV mask 200 to obtain compensated signals (e.g., third, sixth and ninth image signals (Inorm, Inorm 2, Inorm 3)) for each region.

The matrix stored in the storage medium 340 may be analyzed by the determiner 350. The determiner 350 measures the interval between mask patterns drawn on the reflective EUV mask 200 on the basis of the loaded matrix and may detect defects in the reflective EUV mask 200.

Hereinafter, an imaging method using the imaging device and the imaging system including the same according to some embodiments of the present inventive concept will be described with reference to FIG. 9. For the sake of clarity of explanation, the repeated description of items described above will be omitted or simplified.

Figure 9:
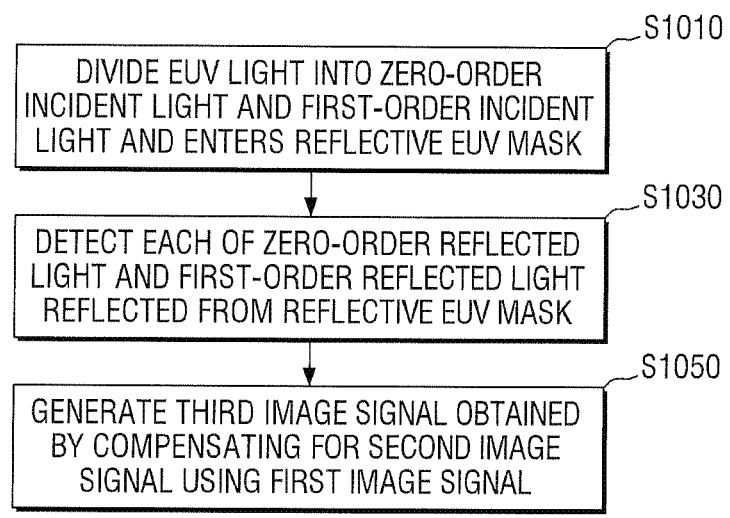
FIG. 9 is a flowchart for explaining an imaging method using the imaging device and the imaging system including the same according to some embodiments of the present inventive concept.

FIG. 9 is a flowchart for explaining an imaging method using the imaging device and the imaging system including the same according to some embodiments of the present inventive concept. Referring to FIG. 9, in step (S1010), the EUV light is divided into zero-order incident light and first-order incident light and may enter the reflective EUV mask. For example, the zone plate (315 of FIG. 2) divides the EUV light (EUV reflected light (Lr) of FIG. 2)) into the zero-order incident light (Li0 of FIG. 2) and the first-order incident light (Li1 of FIG. 2), and may cause the divided light to enter the reflective EUV mask (200 of FIG. 2).

In step (S1030), each of the zero-order reflected light and the first-order reflected light reflected from the reflective EUV mask may be separately detected. For example, the detector (320 of FIG. 2) may separately detect the zero-order reflected light (Lr0 of FIG. 2) and the first-order reflected light (Lr1 of FIG. 2).

In step (S1050), a third image signal may be generated. For example, the calculator (330 of FIG. 2) may generate a third image signal (Inorm of FIG. 2) obtained by compensating for the second image signal (Isig of FIG. 2) relating to the first-order reflected light (Lr1 of FIG. 2), using the first image signal (Io of FIG. 2) relating to the zero-order reflected light (Lr0 of FIG. 2).

Hereinafter, the imaging method using the imaging device and the imaging system including the same according to some embodiments of the present inventive concept will be described with reference to FIG. 10. For the sake of clarity of explanation, repeated description of items described above will be omitted or simplified.

Figure 10:
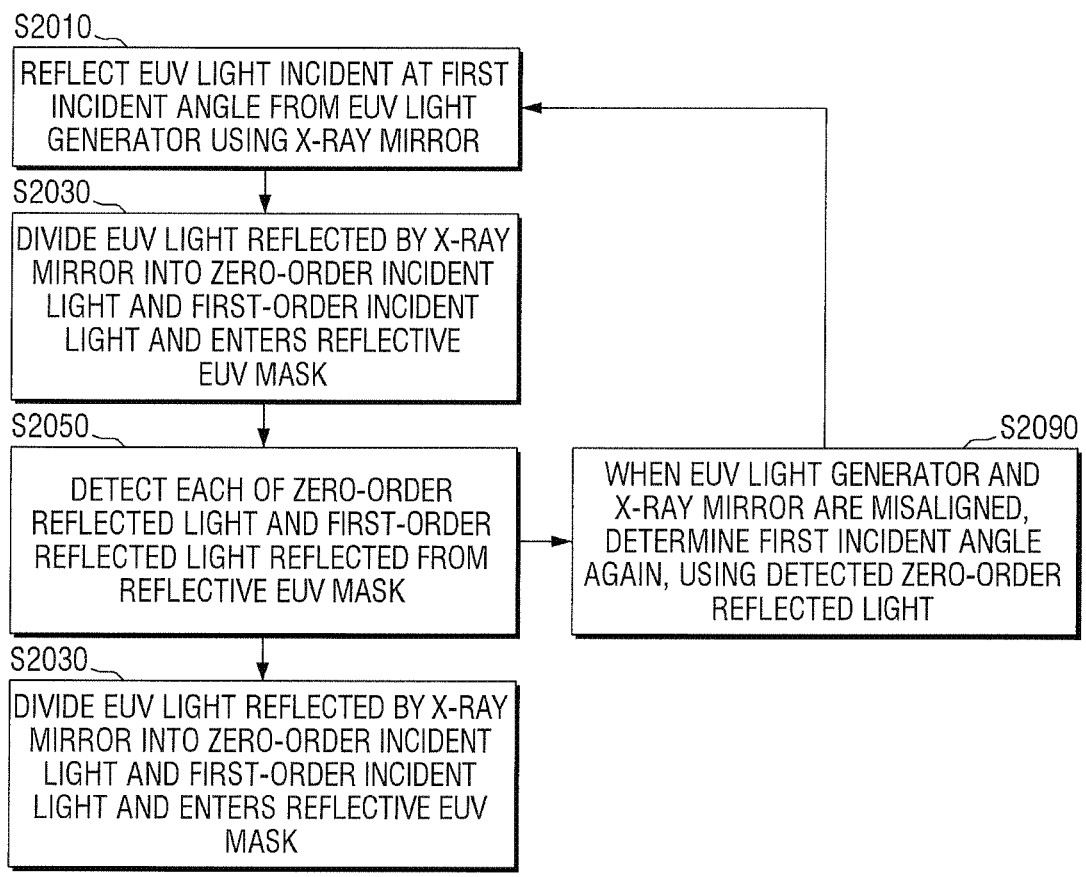
FIG. 10 is a flowchart for explaining an imaging method using the imaging device and the imaging system including the same according to some embodiments of the present inventive concept.

FIG. 10 is a flowchart for explaining an imaging method using the imaging device and the imaging system including the same according to some embodiments of the present inventive concept. Referring to FIG. 10, in step (S2010), the X-ray mirror may reflect the EUV light incident from the EUV light generator at the first incident angle.

In step (S2030), the EUV light reflected by the X-ray mirror is divided into the zero-order incident light and the first-order incident light and may enter the reflective EUV mask. For example, the zone plate (315 of FIG. 2) divides the EUV light (EUV reflected light (Lr) of FIG. 2)) into the zero-order incident light (Li0 of FIG. 2) and the first-order incident light (Li1 of FIG. 2), and may cause the divided light to enter the reflective EUV mask (200 of FIG. 2). Step (S2050) may be the same as step (S1030). Step (S2070) may be the same as step (S1050). Therefore, further description of steps (S2050) and (S2070) will be omitted.

In step (S2090), when the EUV light generator and the X-ray mirror are misaligned, the first incident angle may be determined again. For example, the zero-order light detection region (321 of FIG. 7) of the detector (320 of FIG. 7) may include a plurality of zero-order light sub-detection regions. When the detector (320 of FIG. 7) including a plurality of zero-order light sub-detection regions is used, the intensity of the zero-order reflected light may be measured in each of the plurality of zero-order light sub-detection regions. By comparing the measured intensities, the direction in which the EUV light generator is moved can be obtained. Also, by realigning the EUV light generator and the X-ray mirror on the basis of the direction in which the EUV light generator is moved, the first incident angle can be determined again. Details on this have been described above with reference to FIG. 7.

Hereinafter, a method for fabricating a semiconductor device using the imaging device and the imaging system including the same according to some embodiments of the present inventive concept will be described with reference to FIGS. 1, 11, and 12. For the sake of clarity of explanation, repeated description of items described above will be omitted or simplified.

Figure 11:
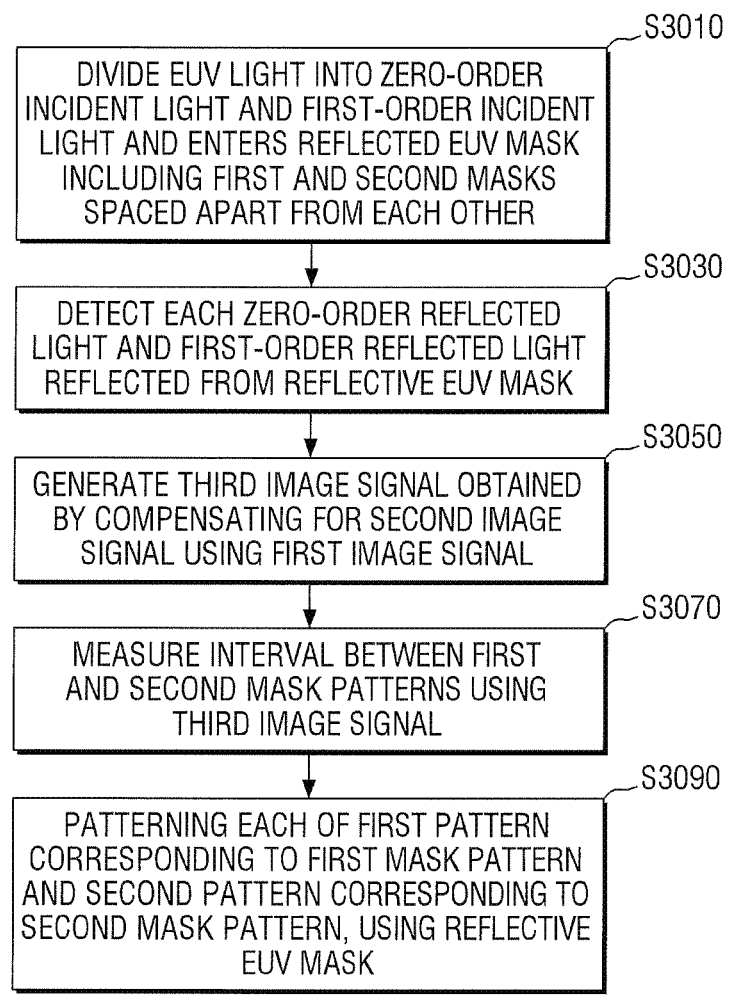
FIG. 11 is a flowchart for explaining an imaging method using the imaging device and the imaging system including the same according to some embodiments of the present inventive concept.

FIG. 11 is a flowchart for explaining an imaging method using the imaging device and the imaging system including the same according to some embodiments of the present inventive concept. FIG. 12 is a diagram illustrating the second region R2 which is the measurement target region MTR of the reflective EUV mask 200 of FIG. 1, and patterning of the second region R2 on the semiconductor substrate 100.

Figure 12:
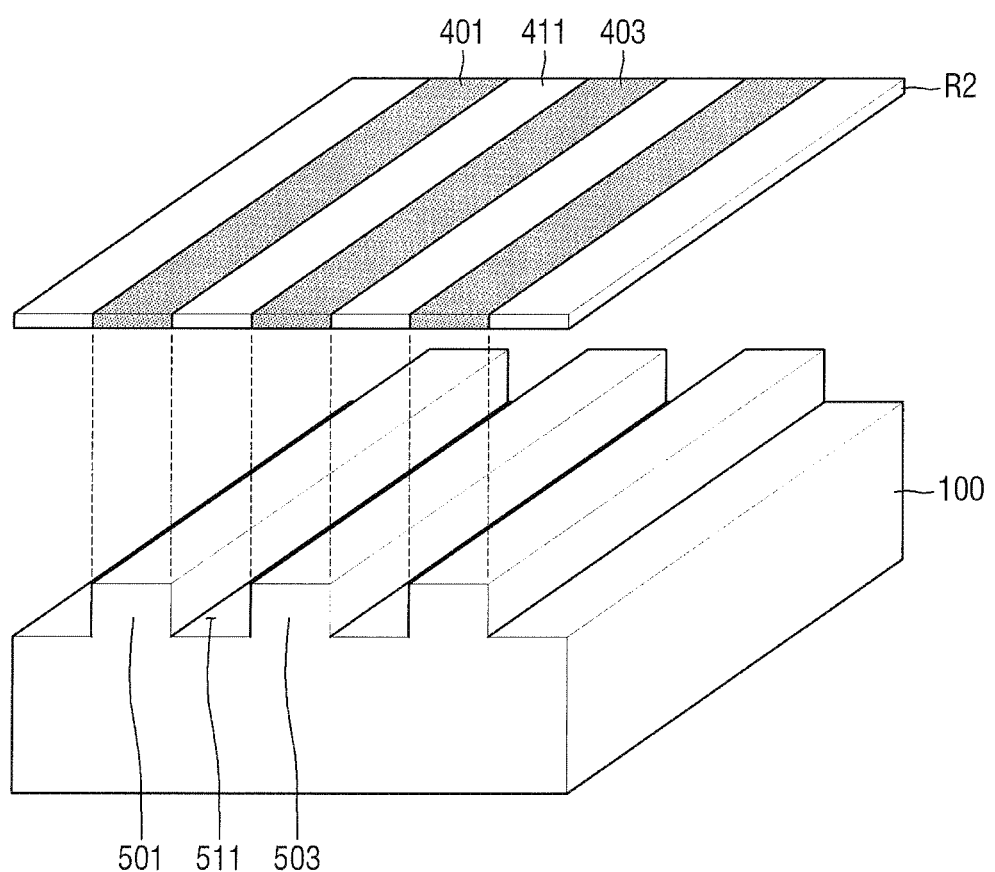
FIG. 12 is a diagram for explaining a second region R2 which is a measurement target region of the reflective EUV mask of FIG. 1 and the patterning of the second region on the semiconductor substrate.

Referring to FIGS. 11 and 12, in step (S3010), the EUV light may be divided into the zero-order incident light and the first-order incident light and may enter the reflective EUV mask. For example, the zone plate (315 of FIG. 2) divides the EUV light (EUV reflected light (Lr of FIG. 2)) into the zero-order incident light (Li0 of FIG. 2) and the first-order incident light (Li1 of FIG. 2), and may cause the divided light to enter the reflective EUV mask 200. The second region R2 of the reflective EUV mask 200 may include a first mask pattern 401 and a second mask pattern 403 that are spaced apart from each other.

Step (S3030) may be the same as step (S1030). Step (S3050) may be the same as step (S1050). Therefore, further description of steps (S3030) and steps (S3050) will be omitted.

In step (S3070), the interval between the first mask pattern 401 and the second mask pattern 403 may be measured, using the third image signal. For example, the determiner (350 of FIG. 2) may measure the first interval (D1 of FIG. 6) between the first mask pattern 401 and the second mask pattern 403, using the threshold value (TH of FIG. 6) and the third image signal (Inorm of FIG. 6). In step (S3070), it is possible to determine whether a defect in the reflective EUV mask is present by measuring the interval between the first mask pattern 401 and the second mask pattern 403.

In step (S3090), the first pattern 501 and the second pattern 503 may be patterned on the semiconductor substrate 100, using a reflective EUV mask. That is, it is possible to perform the step in which, before the patterns (for example, the first mask pattern 401 and the second mask pattern 403) drawn on the reflective EUV mask are patterned on the semiconductor substrate 100, the third image signal (Inorm of FIG. 2) is obtained, and the interval between the first mask pattern 401 and the second mask pattern 403 is measured using the third image signal (Inorm of FIG. 2).

The semiconductor substrate 100 may be bulk silicon or silicon-on-insulator (SOI). In contrast, the semiconductor substrate 100 may be a silicon substrate or may contain other materials, for example, such as silicon germanium, silicon germanium on insulator (SGOI), indium antimonide, lead tellurium compound, indium arsenide, indium phosphorus, gallium arsenide or gallium antimonide, but are not limited thereto. For example, the semiconductor substrate 100 may refer to a wafer.

The first pattern 501 may be a pattern corresponding to the first mask pattern 401 of the reflective EUV mask. The second pattern 503 may be a pattern corresponding to the second mask pattern 403 of the reflective EUV mask. The recess 511 may be a region corresponding to the first separation region 411 of the reflective EUV mask.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method comprising:
    dividing EUV light into zero-order light and first-order light;
    directing the zero-order light and the first-order light to a reflective EUV mask including first and second mask patterns spaced apart from each other;
    detecting the zero-order light and the first-order light reflected from the reflective EUV mask;
    generating respective first and second image signals corresponding to the zero-order light and the first-order light reflected by the reflective EUV mask;
    generating a third image signal from the first and second image signals;
    determining a distance between the first mask pattern and the second mask pattern using the third image signal; and
    forming patterns on a substrate using the reflective EUV mask.

2. The method of claim 1, wherein generating the third image signal comprises dividing the second image signal by the first image signal.

3. The method of claim 1, wherein an intensity of the second image signal is greater than an intensity of the first image signal.

4. The method of claim 1, wherein the first and second mask patterns are formed in a measurement target region of the reflective EUV mask, and wherein the second image signal comprises information for the measurement target region.

5. The method of claim 1, wherein generating respective first and second image signals corresponding to zero-order light and first-order light reflected by the reflective EUV mask comprises generating the first image signal from a zero-order light detection region of a detector and generating the second image signal from a first-order light detection region of the detector.

6. The method of claim 5, wherein generating the first image signal from the zero-order light detection region comprises generating the first image signal using a first probe connected to the zero-order light detection region,
    wherein generating the second image signal from the first-order light detection region comprises generating the second image signal using a second probe connected to the first-order light detection region.

7. The method of claim 1, further comprising:
    reflecting EUV light incident produced by an EUV light generator using an X-ray mirror.

8. The method of claim 7, wherein generating respective first and second image signals corresponding to zero-order light and first-order light reflected by the reflective EUV mask comprises obtaining a plurality of first image signals from respective zero-order light detection subregions of a zero-order light detection region of a detector and obtaining the second image signal from a first-order light detection region of the detector, and wherein the method further comprises determining an angle of incidence of zero-order reflected light reflected by the X-ray mirror.

* * * * *